United States Patent
Tsurui et al.

(10) Patent No.: US 9,548,609 B2
(45) Date of Patent: Jan. 17, 2017

(54) DRIVER CIRCUIT AND IMPEDANCE ADJUSTMENT CIRCUIT

(71) Applicant: KABUSHIKI KAISHA TOSHIBA, Tokyo (JP)

(72) Inventors: Yusuke Tsurui, Oota Tokyo (JP); Ryota Terauchi, Yokohama Kanagawa (JP); Takuma Aoyama, Fujisawa Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 195 days.

(21) Appl. No.: 14/474,022

(22) Filed: Aug. 29, 2014

(65) Prior Publication Data
US 2015/0214731 A1 Jul. 30, 2015

(30) Foreign Application Priority Data

Jan. 30, 2014 (JP) .................................. 2014-015550

(51) Int. Cl.
*H02H 9/04* (2006.01)
*H03K 19/00* (2006.01)

(52) U.S. Cl.
CPC .......... *H02H 9/046* (2013.01); *H03K 19/0005* (2013.01)

(58) Field of Classification Search
CPC ........................... H02H 9/046; H03K 19/0005
USPC ........................................................ 361/56
See application file for complete search history.

(56) References Cited

U.S. PATENT DOCUMENTS

| 7,538,995 B2 | 5/2009 | Okushima | |
|---|---|---|---|
| 2001/0040466 A1* | 11/2001 | Ide | H03K 19/01852 326/83 |
| 2015/0214911 A1* | 7/2015 | Johnson | H03F 3/45941 330/2 |

FOREIGN PATENT DOCUMENTS

| EP | EP 0148577 A1 * | 7/1985 | ......... H01L 27/0255 |
|---|---|---|---|
| JP | 2008-219463 A | 9/2008 | |
| JP | 2009-177594 A | 8/2009 | |
| JP | 2009216565 A | 9/2009 | |
| JP | 2010-232606 A | 10/2010 | |
| JP | 2011035449 A | 2/2011 | |

* cited by examiner

*Primary Examiner* — Scott Bauer
(74) *Attorney, Agent, or Firm* — Patterson & Sheridan, LLP

(57) ABSTRACT

According to one embodiment, a first impedance adjustment circuit of a driver circuit includes a first resistor having an end connected to a first signal node. The first impedance adjustment circuit includes a first MOS transistor having an end connected to the other end of the first resistor. The first impedance adjustment circuit includes a second resistor having an end connected to the first signal node. The first impedance adjustment circuit includes a second MOS transistor having an end connected to the other end of the second resistor. The first impedance adjustment circuit includes a third resistor having an end connected to the other end of the first MOS transistor and the other end of the second MOS transistor, and the other end connected to the first output pad.

19 Claims, 2 Drawing Sheets

DRIVER CIRCUIT AND IMPEDANCE ADJUSTMENT CIRCUIT

CROSS-REFERENCE TO RELATED APPLICATION

This application is based upon and claims the benefit of priority from Japanese Patent Application No. 2014-015550, filed Jan. 30, 2014, the entire contents of which are incorporated herein by reference.

FIELD

Embodiments described herein relate generally to a driver circuit and an impedance adjustment circuit.

BACKGROUND

A semiconductor integrated circuit including a MOS transistor is known to malfunction if damaged by an Electrostatic Discharge (ESD).

As an ESD model of the semiconductor integrated circuit, following three types are present:
(1) Human Body Model (HBM): human body charging model
(2) Machine Model (MM): machine model
(3) Charged Device Model (CDM): device charging model The HBM and the MM are models with respect to ESD damage caused by an object charged with a static electricity from the outside. The CDM is a model with respect to ESD damage when the semiconductor integrated circuit itself is charged and discharges to a metal contact.

During microfabrication and operation of a semiconductor integrated circuit, an ESD countermeasure is typically applied, and ESD protection circuits have been developed for these uses. However, since it is preferred that a chip area and a size of the ESD protection circuit be reduced, and the possible ESD discharge pathways are complicated, it is difficult to provide ESD resistance to a semiconductor device.

DETAILED DESCRIPTION

The present disclosure describes a driver circuit with reduced circuit area and an improved ESD resistance in an impedance adjustment circuit as an example.

In general, according to one embodiment, a driver circuit includes a differential output circuit that outputs a differential signal from a first signal node and a second signal node according to a data signal. The driver circuit includes a first impedance adjustment circuit that is connected between the first signal node and a first output pad of the driver circuit to provide a first impedance therebetween, and is capable of adjusting the first impedance in response to an input voltage. The driver circuit includes a second impedance adjustment circuit that is connected between the second signal node and a second output pad of the driver circuit to provide a second impedance therebetween, and is capable of adjusting the second impedance in response to the input voltage. The driver circuit includes an ESD protection circuitry that protects the differential output circuit from ESD events on the first and second output pads.

In an embodiment, the first impedance adjustment circuit includes a first resistor having an end connected to the first signal node. The first impedance adjustment circuit includes a first MOS transistor having an end connected to the other end of the first resistor. The first impedance adjustment circuit includes a second resistor having an end connected to the first signal node. The first impedance adjustment circuit includes a second MOS transistor having an end connected to the other end of the second resistor. The first impedance adjustment circuit includes a third resistor having an end connected to the other end of the first MOS transistor and the other end of the second MOS transistor, and the other end connected to the first output pad. The first impedance adjustment circuit includes a first diode having a cathode is connected to the power supply terminal and an anode connected to the first signal node. The first impedance adjustment circuit includes a second diode having a cathode connected to the power supply terminal and an anode connected to the end of the third resistor.

Hereinafter, an example embodiment is described with reference to the drawings. Although a case where the impedance adjustment circuit is applied to a driver circuit of a transmitter is described, it is possible to similarly apply the impedance adjustment circuit to a receiver.

First Embodiment

Figure 1:
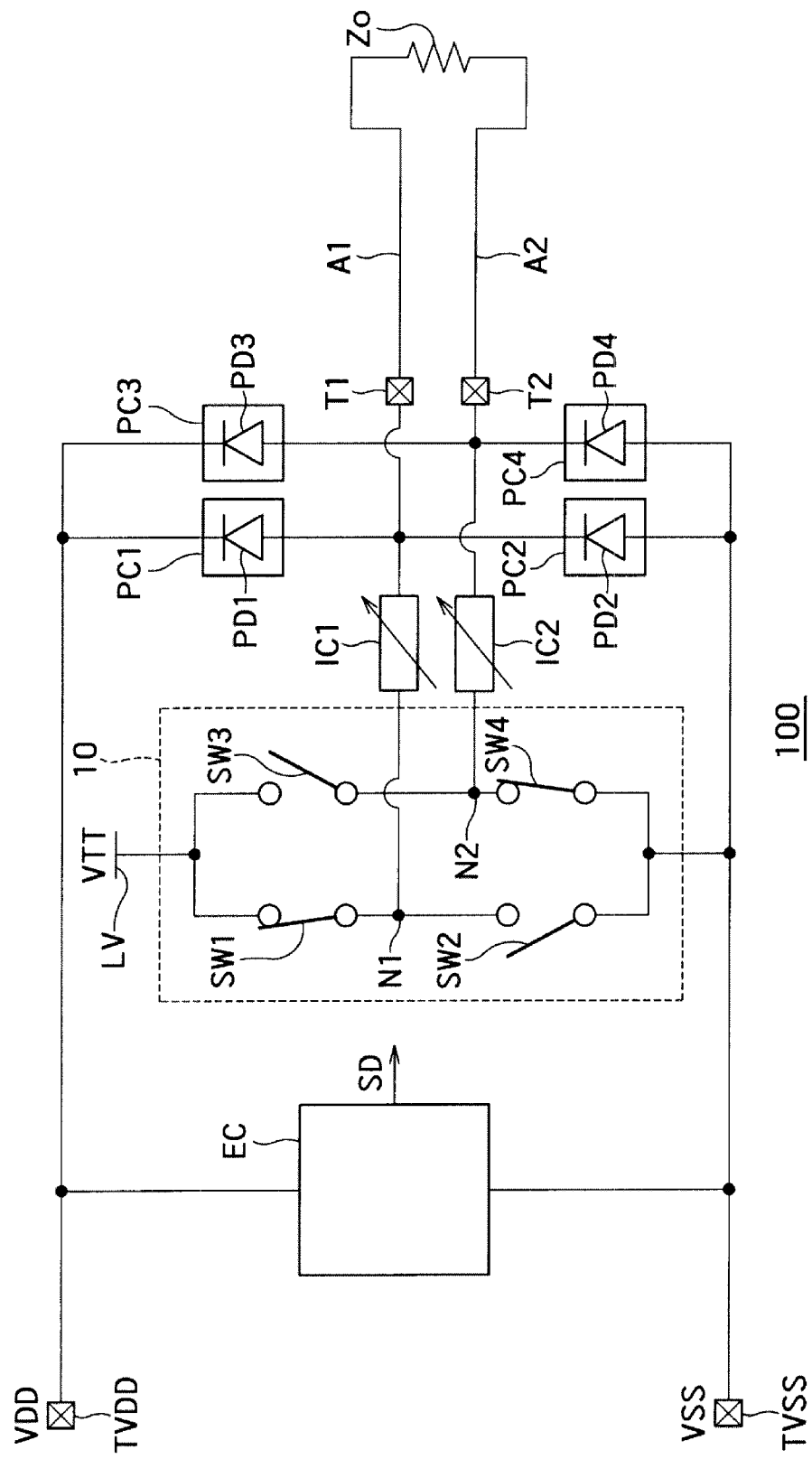
FIG. 1 is a circuit diagram illustrating an example configuration of a driver circuit according to a first embodiment.

FIG. 1 is a circuit diagram showing an example configuration of a driver circuit 100 according to a first embodiment.

As illustrated in FIG. 1, the driver circuit 100 includes a power supply terminal TVDD, a grounding terminal TVSS, a first output pad T1, a second output pad T2, a differential output circuit 10, a first impedance adjustment circuit IC1 (first impedance trimming circuit), a second impedance adjustment circuit IC2 (second impedance circuit), a first protection circuit PC1, a second protection circuit PC2, a third protection circuit PC3, a fourth protection circuit PC4, and an ESD protection circuit EC. Driver circuit 100 is, for example, applied to a transmitter and outputs a predetermined output signal (transmission signal) from the first output pad T1 and the second output pad T2, based on a data signal SD which includes transmission data.

The power supply terminal TVDD is supplied with a power supply voltage VDD.

The grounding terminal TVSS is connected to the ground and is a grounding voltage VSS.

An end of a first transmission line A1 is connected to the first output pad T1.

An end of a second transmission line A2 is connected to the second output pad T2.

A terminating resistor Z0 is connected between the other end of the first transmission line A1 and the other end of the second transmission line A2.

The differential output circuit 10 outputs a differential signal from a first signal node N1 and a second signal node N2. The differential signal corresponds to the data signal SD.

As illustrated in FIG. 1, the differential output circuit 10 includes, for example, a first switch element SW1, a second switch element SW2, a third switch element SW3, and a fourth switch element SW4.

One end of the first switch element SW1 is connected to a voltage terminal LV, and the other end of the first switch element SW1 is connected to the first signal node N1. In addition, a voltage VTT which is lower than the power supply voltage VDD of the power supply terminal TVDD is supplied to the voltage terminal LV.

One end of the second switch element SW2 is connected to the first signal node N1, and the other end of the second switch element SW2 is connected to the grounding terminal TVSS.

One end of the third switch element SW3 is connected to the voltage terminal LV, and the other end of the third switch element SW3 is connected to the second signal node N2.

One end of the fourth switch element SW4 is connected to the second signal node N2, and the other end of the fourth switch element SW4 is connected to the grounding terminal TVSS.

In addition, in one embodiment, the first to fourth switch elements SW1 to SW4 are MOS transistors.

Here, according to the data signal SD, the differential output circuit 10 switches between a first state where the first switch element SW1 and the fourth switch element SW4 are ON and the second switch element SW2 and the third switch element SW3 are OFF, and a second state where the first switch element SW1 and the fourth switch element SW4 are OFF and the second switch element SW2 and the third switch element SW3 are ON.

In other words, according to the data signal SD, the differential output circuit 10 complimentarily turns on and off the first switch element SW1 and the second switch element SW2, and complimentarily turns on and off the third switch element SW3 and the fourth switch element SW4.

According to the operation of the differential output circuit 10, the differential signal is output from the first signal node N1 and the second signal node N2.

In addition, the first impedance adjustment circuit IC1 is connected between the first signal node N1 of the differential output circuit 10 and the first output pad T1. The first impedance adjustment circuit IC1 is configured to adjust the impedance.

In addition, the second impedance adjustment circuit IC2 is connected between the second signal node N2 of the differential output circuit 10 and the second output pad T2. The second impedance adjustment circuit IC2 is configured to adjust the impedance.

The first protection circuit PC1 is connected between the power supply terminal TVDD and the first output pad T1. The first protection circuit PC1 protects the differential output circuit 10, for example, from the ESD.

For example, as illustrated in FIG. 1, the first protection circuit PC1 includes a first protection diode PD1 having a cathode connected to the power supply terminal TVDD and an anode connected to the first output pad T1.

In addition, the second protection circuit PC2 is connected between the grounding terminal TVSS and the first output pad T1. The second protection circuit PC2 protects the differential output circuit 10, for example, from the ESD.

The second protection circuit PC2 includes a second protection diode PD2 having a cathode connected to the first output pad T1 and an anode connected to the grounding terminal TVSS.

In addition, the third protection circuit PC3 is connected between the power supply terminal TVDD and the second output pad T2. The third protection circuit PC3 protects the differential output circuit 10, for example, from the ESD.

The third protection circuit PC3 includes a third protection diode PD3 having a cathode connected to the power supply terminal TVDD and an anode connected to the second output pad T2.

In addition, the fourth protection circuit PC4 is connected between the grounding terminal TVSS and the second output pad T2. The fourth protection circuit PC4 protects the differential output circuit 10, for example, from the ESD.

The fourth protection circuit PC4 includes a fourth protection diode PD4 having a cathode connected to the second output pad T2 and an anode connected to the grounding terminal TVSS.

In addition, the ESD protection circuit EC is connected between the power supply terminal TVDD and the grounding terminal TVSS. A resistance value of the ESD protection circuit EC becomes low when a potential difference between the power supply terminal TVDD and the grounding terminal TVSS is equal to or higher than a specified value, which is set in advance.

Hereinafter, the first impedance adjustment circuit IC1 and the second impedance adjustment circuit IC2 which are illustrated in FIG. 1 are described in detail. For simplification, a circuit configuration of the first impedance adjustment circuit IC1 illustrated in FIG. 1 is described as an example, but the depicted internal configuration is similar for the second impendence adjustment circuit IC2.

Figure 2:
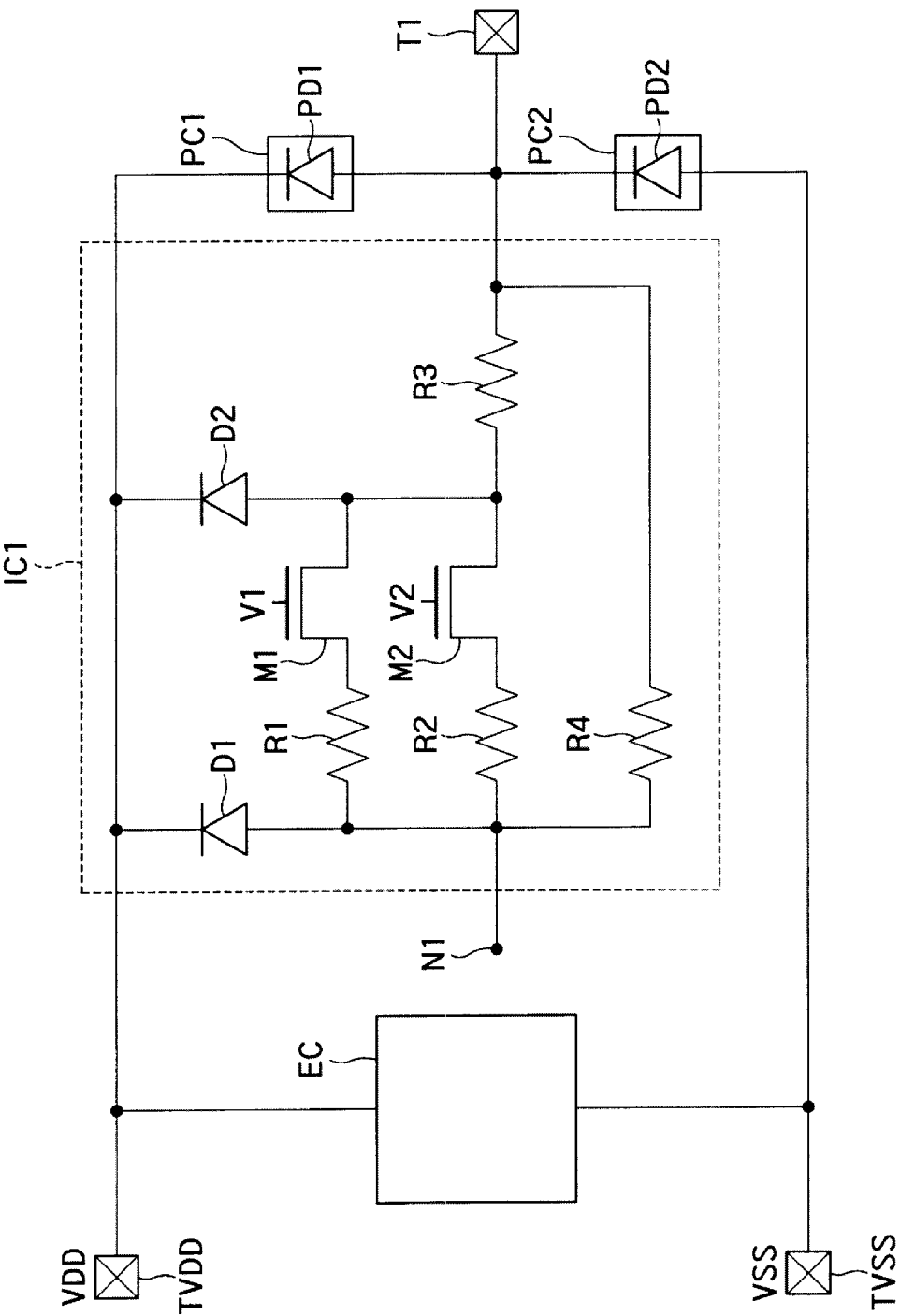
FIG. 2 is a circuit diagram showing an example configuration of a first impedance adjustment circuit of the driver circuit illustrated in FIG. 1, a first protection circuit, a second protection circuit, and an ESD protection circuit.

FIG. 2 is a circuit diagram showing an example of a circuit configuration which focuses on the first impedance adjustment circuit IC1 of the driver circuit 100 illustrated in FIG. 1, the first protection circuit PC1, the second protection circuit PC2 (the first protection diode PD1 and the second protection diode PD2), and the ESD protection circuit EC.

As illustrated in FIG. 2, the first impedance adjustment circuit IC1 includes, in one embodiment, a first resistor R1, a second resistor R2, a third resistor R3, a fourth resistor R4, a first MOS transistor M1, a second MOS transistor M2, a first diode D1, and a second diode D2.

One end of the first resistor R1 is connected to the first signal node N1.

One end of the first MOS transistor M1 is connected to the other end of the first resistor R1.

One end of the second resistor R2 is connected to the first signal node N1.

One end of the second MOS transistor M2 is connected to the other end of the second resistor R2.

As illustrated in FIG. 2, the first MOS transistor M1 and the second MOS transistor M2 are, for example, nMOS transistors.

One end of the third resistor R3 is connected to the other end of the first MOS transistor M1 and the other end of the second MOS transistor M2, and the other end of the third resistor R3 is connected to the first output pad T1.

One end of the fourth resistor R4 is connected to the first signal node N1, and the other end of the fourth resistor R4 is connected to the first output pad T1. The fourth resistor R4 functions as a resistor for impedance adjustment. The fourth resistor R4 sets the resistance value at the circuit design stage, but it is possible to adjust the impedance of the impedance adjustment circuit IC1.

The cathode of the first diode D1 is connected to the power supply terminal TVDD, and the anode of the first diode D1 is connected to the first signal node N1.

The cathode of the second diode D2 is connected to the power supply terminal TVDD, and the anode of the second diode D2 is connected to the one end of the third resistor R3.

A voltage V1 and a voltage V2 are respectively supplied to the gate of the first MOS transistor M1 and to the gate of the second MOS transistor M2.

According to the voltages V1 and V2, the first MOS transistor M1 and the second MOS transistor M2 are set to be ON or OFF. For example, when the voltage V1 is set to be higher than a threshold voltage of the first MOS transistor M1, and when the voltage V2 is set to be lower than a threshold voltage of the second MOS transistor M2, the first MOS transistor M1 is ON and the second MOS transistor M2 is OFF. Accordingly, the impedance of the first impedance adjustment circuit IC1 is a value which is determined by a combined resistance of the first resistor R1, the third resistor R3, and the fourth resistor R4.

Accordingly, the impedance of the first impedance adjustment circuit IC1 is trimmed to be a predetermined value.

In addition, as the number of resistor groups (conducting pathways) including a resistor connected between the first signal node N1 and the third resistor R3 in series and the MOS transistor increases, it is possible to more finely adjust or trim the impedance. That is, more than two resistor/transistor pairs can be incorporated into the first impedance adjustment circuit IC1. Here, the third resistor R3 and the second diode D2 function as a protection circuit with respect to the first MOS transistor M1 and the second MOS transistor M2.

Accordingly, it is possible to protect the first MOS transistor M1 and the second MOS transistor M2 from a surge voltage of the Charged Device Model (CDM).

In addition, the resistance values of the first resistor R1 and the second resistor R2 are set to be larger than the resistance value of the third resistor R3.

Accordingly, in the above-described configuration, compared to a case where the first MOS transistor M1 and the second MOS transistor M2 are disposed on a side closer to a power supply than the first resistor R1 and the second resistor R2, each of a drain voltage and a source voltage of the first MOS transistor M1 and the second MOS transistor M2 is a value which becomes low by about 0.1 V, for example.

Accordingly, it is possible to obtain an equal ON resistance with a smaller size of the first MOS transistor M1 and the second transistor M2.

In other words, according to the above-described configuration, it is possible to reduce the size of the first MOS transistor M1 and the second transistor M2.

As the size of the first MOS transistor M1 and the size of the second transistor M2 are reduced, it is possible to suppress a reduction in bandwidth of the driver circuit 100 caused by a parasitic capacitance of the MOS transistors. In other words, the driver circuit 100 may have a much higher frequency band.

In addition, as described above, a circuit configuration which focuses on the second impedance adjustment circuit IC2, the third protection circuit PC3, the fourth protection circuit PC4, and the ESD protection circuit EC also has a similar configuration to the circuit configuration illustrated in FIG. 2. In other words, the second impedance adjustment circuit IC2 includes a circuit configuration similar to the first impedance adjustment circuit IC1.

Next, an example of an operation of a case where the surge voltage of the CDM is applied in the driver circuit 100 having the above-described configuration will be described with reference to FIG. 2.

For example, when the surge voltage of the CDM is applied to the first output pad T1, a discharge current flows to a side of the power supply terminal TVDD from the first protection diode PD1. Under a condition of the CDM in which a much higher surge voltage is applied to the output pad, in addition to the first protection diode PD1, an additional protection circuit is required. The third resistor R3 and the second diode D2 operate as local clamps with respect to the first MOS transistor M1 and the second MOS transistor M2, and function as the additional protection circuit. In other words, a part of the discharge current flows to the side of the power supply terminal TVDD via the third resistor R3 and the second diode D2.

As described above, when the potential difference between the power supply terminal TVDD and the grounding terminal TVSS is equal to or higher than the specified value set in advance, the resistance value of the ESD protection circuit EC is low. Accordingly, the discharge current flows to the grounding terminal TVSS.

Accordingly, it is possible to protect the first MOS transistor M1 and the second MOS transistor M2 of the first impedance adjustment circuit IC1 configuring the driver circuit 100 from ESD.

As described above, according to the driver circuit of the embodiment, it is possible to reduce the circuit area and improve the ESD resistance with respect to the impedance adjustment circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A driver circuit, comprising:
   a differential output circuit configured to output a differential signal at a first signal node and a second signal node according to a data signal;
   a first output pad;
   a second output pad;
   a power supply terminal;
   a grounding terminal;
   a first impedance adjustment circuit connected between the first output pad and the first signal node of the differential output circuit, and configured to provide a first impedance between the first output pad and the first signal node and to adjust the first impedance in response to an input voltage;
   a second impedance adjustment circuit connected between the second output pad and the second signal node of the differential output circuit, and configured to provide a second impedance between the second output pad and the second signal node and to adjust the second impedance in response to the input voltage; and
   an ESD protection circuit connected between the power supply terminal and the grounding terminal, wherein the first impedance adjustment circuit includes:
   a first resistor having an end connected to the first signal node;
   a first MOS transistor having an end connected to the other end of the first resistor;
   a second resistor having an end connected to the first signal node;
   a second MOS transistor having an end connected to the other end of the second resistor;
   a third resistor having an end connected to the other end of the first MOS transistor and the other end of the second MOS transistor, and the other end connected to the first output pad;

a first diode having a cathode connected to the power supply terminal and an anode connected to the first signal node; and a second diode having a cathode connected to the power supply terminal and an anode connected to the end of the third resistor.

2. The driver circuit according to claim 1, wherein the first impedance adjustment circuit further includes a fourth resistor having an end connected to the first signal node and the other end connected to the first output pad.

3. The driver circuit according to claim 1, wherein a resistance value of the first resistor and a resistance value of the second resistor are each larger than a resistance value of the third resistor.

4. The driver circuit according to claim 1, wherein a gate of the first MOS transistor and a gate of the second MOS transistor are, respectively, connected to different voltages.

5. The driver circuit according to claim 1, further comprising:
a first protection circuit connected between the power supply terminal and the first output pad;
a second protection circuit connected between the grounding terminal and the first output pad;
a third protection circuit connected between the power supply terminal and the second output pad; and
a fourth protection circuit connected between the grounding terminal and the second output pad.

6. The driver circuit according to claim 5, wherein
the first protection circuit includes a first protection diode of which a cathode is connected to the power supply terminal and of which an anode is connected to the first output pad,
the second protection circuit includes a second protection diode of which a cathode is connected to the first output pad and of which an anode is connected to the grounding terminal,
the third protection circuit includes a third protection diode of which a cathode is connected to the power supply terminal and of which an anode is connected to the second output pad, and
the fourth protection circuit includes a fourth protection diode of which a cathode is connected to the second output pad and of which an anode is connected to the grounding terminal.

7. The driver circuit according to claim 1, wherein the differential output circuit includes:
a first switch element having an end connected to a voltage terminal and the other end connected to the first signal node;
a second switch element having an end connected to the first signal node and the other end connected to the grounding terminal;
a third switch element having an end connected to the voltage terminal and the other end connected to the second signal node; and
a fourth switch element having an end connected to the second signal node and the other end connected to the grounding terminal, wherein
the differential output circuit switches between a first state where the first switch element and the fourth switch element are ON and the second switch element and the third switch element are OFF, and a second state where the first switch element and the fourth switch element are OFF and the second switch element and the third switch element are ON in accordance with the data signal.

8. The driver circuit according to claim 1, wherein the ESD protection circuit that is connected between the power supply terminal and the grounding terminal and has a resistance value that becomes low when a potential difference between the power supply terminal and the grounding terminal is equal to or higher than a predetermined value.

9. An impedance adjustment circuit for adjusting an impedance between a signal node and an output pad, the impedance adjustment circuit comprising:
a first resistor having one end connected to the signal node;
a first MOS transistor having one end connected to the other end of the first resistor;
a second resistor having one end connected to the signal node;
a second MOS transistor having one end connected to the other end of the second resistor;
a third resistor having one end connected to the other end of the first MOS transistor and the other end of the second MOS transistor, the third resistor having the other end connected to the output pad;
a first diode having a cathode connected to a power supply terminal and an anode connected to the signal node; and
a second diode having a cathode connected to the power supply terminal and an anode connected to the end of the third resistor.

10. The impedance adjustment circuit according to claim 9, wherein the first and second resistors each have a resistance value that is greater than a resistance value of the third resistor.

11. An impedance adjustment circuit, comprising:
a signal input node and a signal output node;
a fixed impedance provided between the signal input node and the signal output node, the fixed impedance having a first end connected to the signal input node and a second end connected to the signal output node; and
an impedance trimming circuit provided in parallel with the fixed impedance between the signal input node and the signal output node, the impedance trimming circuit including:
a first resistor and a first switch connected in series between an internal node and the signal input node,
a third resistor connected between the signal output node and the internal node, the third resistor having a first end connected to the internal node and a second end connected to the signal output node and the second end of the fixed impedance, wherein the impedance trimming circuit is configured to trim the fixed impedance in response to a first control input that closes the first switch.

12. The impedance adjustment circuit according to claim 11, wherein the impedance trimming circuit further includes:
a second resistor and a second switch connected in series between the internal node and the signal input node, wherein the impedance trimming circuit is configured to trim the fixed impedance in response to a second control input that closes the second switch.

13. The impedance adjustment circuit according to claim 11, wherein the impedance trimming circuit further includes:
a protection circuit connected between the internal node and a power supply terminal.

14. The impedance adjustment circuit according to claim 13, wherein the protection circuit comprises a diode having an anode connected to the internal node and a cathode connected to the power supply terminal.

15. The impedance adjustment circuit according to claim 11, wherein the impedance trimming circuit further includes:
  a protection circuit connected between the signal input node and a power supply terminal.

16. The impedance adjustment circuit according to claim 12, wherein the second resistor has a resistance value that is greater than a resistance value of the third resistor.

17. The impedance adjustment circuit according to claim 15, wherein the protection circuit comprises a diode having an anode connected to the signal input node and a cathode connected to the power supply terminal.

18. The impedance adjustment circuit according to claim 11, wherein the first resistor has a resistance value that is greater than a resistance value of the third resistor.

19. The impedance adjustment circuit according to claim 11, wherein the first switch is metal-oxide-semiconductor field effect transistor.

* * * * *